United States Patent [19]
Wert et al.

[11] Patent Number: 5,534,795
[45] Date of Patent: Jul. 9, 1996

[54] VOLTAGE TRANSLATION AND OVERVOLTAGE PROTECTION

[75] Inventors: Joseph D. Wert, Arlington; Richard L. Duncan, Bedford, both of Tex.

[73] Assignee: National Semiconductor Corporation, Santa Clara, Calif.

[21] Appl. No.: 352,482

[22] Filed: Dec. 9, 1994

Related U.S. Application Data

[62] Division of Ser. No. 72,896, Jun. 7, 1993, Pat. No. 5,406,140.

[51] Int. Cl.$^6$ .................. H03K 19/0185; H03K 19/0948
[52] U.S. Cl. ............................. 326/81; 326/83; 326/58; 327/534
[58] Field of Search .................. 326/83, 86, 57–58, 326/27, 21, 33, 80, 81, 121; 327/534, 546; 361/91

[56] References Cited

U.S. PATENT DOCUMENTS

| | | |
|---|---|---|
| 3,949,242 | 4/1976 | Hirasawa et al. . |
| 4,017,830 | 4/1977 | Shigemori et al. .................. 340/146.2 |
| 4,473,758 | 9/1984 | Huntington . |
| 4,490,633 | 12/1984 | Noufer et al. . |
| 4,556,804 | 12/1985 | Dewitt . |
| 4,574,273 | 3/1986 | Atsumi et al. . |
| 4,583,203 | 4/1986 | Monk . |
| 4,583,204 | 4/1986 | Takemae et al. . |
| 4,617,473 | 10/1986 | Bingham . |
| 4,638,182 | 1/1987 | McAdams . |
| 4,656,373 | 4/1987 | Plus . |
| 4,670,668 | 6/1987 | Liu . |
| 4,670,861 | 6/1987 | Shu et al. . |
| 4,727,266 | 2/1988 | Fujii et al. ................................ 326/27 |
| 4,740,713 | 4/1988 | Sakurai et al. . |
| 4,825,275 | 4/1989 | Tomassetti . |
| 4,837,462 | 6/1989 | Watanabe et al. . |
| 4,862,240 | 8/1989 | Watanabe et al. . |
| 4,864,373 | 9/1989 | Miyashita . |
| 4,906,056 | 3/1990 | Taniguchi . |
| 4,930,112 | 5/1990 | Tanaka et al. . |

(List continued on next page.)

FOREIGN PATENT DOCUMENTS

| | | |
|---|---|---|
| 2373921 | 7/1978 | France . |
| 3729951 | 6/1989 | Germany . |
| PCT/US91/ 08341 | 11/1991 | WIPO . |

OTHER PUBLICATIONS

Paper entitled: "A Tidal Wave of 3–V ICs Opens Up Many Options" by Dave Bursky, published in Electronic Design, Aug. 20, 1992, pp. 37–47.

Article entitled: "Level Transistor Logic with no DC Power Dissipation" published in the International Technology Disclosure Journal 9:06 by author unknown 104279.

IBM Technical Disclosure Bulletin, vol. 34, No. 48, Sep. 1991, New York, US, pp. 147–149.

*Primary Examiner*—Edward P. Westin
*Assistant Examiner*—Jon Santamauro
*Attorney, Agent, or Firm*—Skjerven, Morrill MacPherson, Franklin & Friel

[57] ABSTRACT

A voltage translator is provided that translates a lower voltage to a higher voltage, for example, a 3.3 V voltage to a 5.0 V voltage. The 3.3 V voltage is received on source/drain terminal N1 of an NMOS transistor. The transistor gate is at 3.3 V. The other source/drain terminal N2 of the transistor is connected to an input of a CMOS inverter powered by 5.0 V. The inverter output is connected to the gate of a PMOS transistor connected between 5.0 V and terminal N2. The PMOS transistor pulls terminal N2 to 5.0 V when terminal N1 is at 3.3 V. The same translator is suitable for translating a 5.0 V voltage on terminal N1 to 3.3 V on terminal N2 if the inverter is powered by 3.3 V and the PMOS transistor is connected between 3.3 V and terminal N2. Also, an output driver is provided in which a voltage protection circuitry prevents charge leakage from the driver output terminal to the driver's power supply when the voltage on the bus connected to the output terminal exceeds the power supply voltage.

12 Claims, 5 Drawing Sheets

U.S. PATENT DOCUMENTS

| | | |
|---|---|---|
| 4,952,825 | 8/1990 | Yoshida . |
| 4,961,010 | 10/1990 | Davis . |
| 5,004,936 | 4/1991 | Andresen ................................. 326/27 |
| 5,027,008 | 6/1991 | Runaldue . |
| 5,036,222 | 7/1991 | Davis . |
| 5,060,044 | 10/1991 | Tomassetti . |
| 5,087,579 | 2/1992 | Tomassetti . |
| 5,117,129 | 5/1992 | Hoffman et al. . |
| 5,128,560 | 7/1992 | Chern et al. . |
| 5,134,316 | 7/1992 | Ta . |
| 5,157,279 | 10/1992 | Lee ............................................ 326/83 |
| 5,160,855 | 11/1992 | Dobberpuhl . |
| 5,191,244 | 3/1993 | Runaldue et al. ........................ 326/86 |
| 5,266,849 | 11/1993 | Kitahara et al. ........................ 327/534 |
| 5,350,951 | 9/1994 | Adachi . |
| 5,381,061 | 1/1995 | Davis ...................................... 327/534 |

VOLTAGE TRANSLATION AND OVERVOLTAGE PROTECTION

This application is a division of application Ser. No. 08/072,896, filed Jun. 6, 1993, now U.S. Pat No. 5,406,140.

BACKGROUND OF THE INVENTION

1. Field of the Invention

The present invention relates to systems in which different modules accept different voltage levels, and more particularly to translation from one voltage level to another and to overvoltage protection of modules accepting lower voltage levels.

2. Description of Related Art

Many modern systems combine modules accepting different voltage levels, for example, modules powered by different power supply voltages. For example, in battery powered laptop, notebook and hand-held computers, some modules are powered by a 3.3 V voltage while others are powered by a 5.0 V voltage. The use of the lower power supply voltage such as 3.3 V reduces power consumption. However, modules such as disc drives are powered by 5.0 V because they perform better when powered by the higher voltage.

To translate a signal produced by a 3.3 V module to a level acceptable by a 5.0 V module, one can use a CMOS inverter powered by 5.0 V. The inverter powered by 5.0 V receives a signal from the 3.3 V module and provides a voltage level acceptable for the 5.0 V module. However, the 5.0 V CMOS inverter consumes much power when its input is at 3.3 V. There is a need therefore for a power efficient voltage translator.

Further, when the output driver of the 3.3 V module is disabled and the 5.0 V module drives a common bus with 5.0 V, a charge leakage path may form between the bus and the 3.3 V power supply. For example, suppose that the output driver of the 3.3 V module includes a PMOS pull-up transistor connected between the 3.3 V voltage and the bus. When the bus is driven by the 5.0 V module, the 3.3 V module drives the PMOS transistor gate to 3.3 V to turn the transistor off to disable the driver. However, when the bus voltage rises to 5.0 V, the PMOS transistor turns on providing a conductive channel between the bus and the 3.3 V power supply. Moreover, because the PMOS transistor backgate is typically held at 3.3 V, the drain/backgate diode turns on providing another conductive path between the bus and the 3.3 V power supply. The undesirable results include loading the bus and causing "bus contention", degrading the bus signals, and causing possible false signals on the bus.

Similar problems occur when a selected module is powered down while other modules are powered up, whether or not different power supply voltages are used in the system. When the modules powered down in order, for example, to save power or to replace the module, a leakage path can form between the bus and the module internal power supply.

Thus, it is desirable to provide output drivers which do not provide a leakage path between the bus and the module internal power supply.

SUMMARY OF THE INVENTION

The present invention provides in some embodiments a voltage translator with a low power consumption. In some embodiments the translator includes an NMOS transistor interconnecting a translator node N1 receiving a 3.3 V signal and a node N2 that provides a 5.0 V signal. The NMOS transistor gate is connected to 3.3 V. Node N2 is connected to an input of a CMOS inverter powered by 5.0 V. The inverter drives the gate of a PMOS transistor connected between the 5.0 V voltage and node N2. When the voltage on node N1 is 3.3 V, the NMOS transistor charges node N2 to a voltage above the inverter threshold voltage. Consequently, the PMOS transistor turns on charging node N2 to 5.0 V. When node N2 is at 5.0 V, the inverter power consumption is low. The NMOS transistor is off isolating node N1 and the circuitry connected to node N1 from the 5.0 V voltage on node N2.

In some embodiments, one and the same translator is suitable for translating from 3.3 V to 5.0 V, from 5.0 V to 3.3 V, and also for providing 3.3 V signals from a 3.3 V module and 5.0 V signals from a 5.0 V module. For example, in some embodiments, the module has two power pins. One power pin receives the module internal supply voltage VDDI, and the other power pin receives the supply voltage EXTVDD which powers the translator output signals. Thus, if the module is to be powered by 3.3 V and the translator is to translate a 3.3 V signal to a 5.0 V signal, VDDI=3.3 V and EXTVDD=5.0 V. Alternatively, the power pins can be connected so that VDDI=5.0 V and EXTVDD=3.3 V, or VDDI=EXTVDD=3.3 V, or VDDI=EXTVDD=5.0 V. In any case, the translator translates a VDDI level signal into an EXTVDD level signal. Such a translator provides a great flexibility because the same module can be used with different combinations of power supply voltages.

The present invention also provides overvoltage protection by blocking charge leakage paths when a voltage on a bus exceeds in magnitude a power supply voltage of a module connected to the bus. In some embodiments, a PMOS pull-up transistor is connected between the supply voltage and the bus. A comparator compares the voltage on the bus with the supply voltage. When the bus voltage exceeds in magnitude the supply voltage by at least the absolute value |VTP| of the PMOS threshold voltage, the comparator and associated circuitry connect the gate and the backgate of the PMOS pull-up transistor to the bus so that the gate and the backgate are at the bus voltage. Hence, the field effect conduction of the PMOS transistor and the conduction through the transistor drain/backgate diode are suppressed, eliminating the charge leakage.

Other features of the invention are described below. The invention is defined by the appended claims.

DESCRIPTION OF THE PREFERRED EMBODIMENTS

Figure 1:
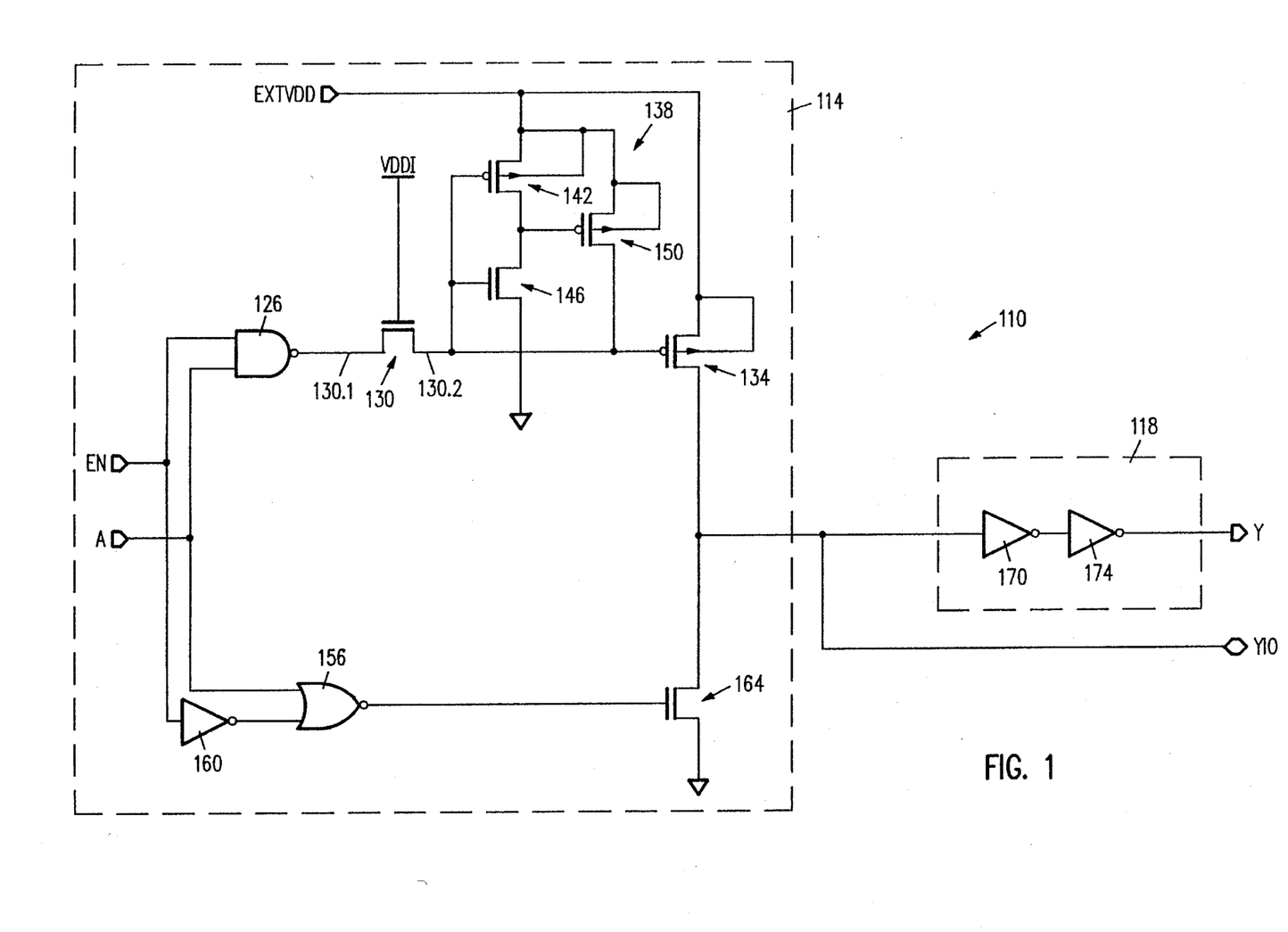
FIGS. 1–4 are circuit diagrams of input/output buffers according to the present invention.

FIG. 1 is a circuit diagram a portion 110 of a module powered by a voltage VDDI (VDD Internal). Portion 110 is an input/output buffer which interfaces the module with a bus driven by a different voltage EXTVDD (External VDD). In some embodiments, VDDI=3.3 V and EXTVDD=5.0 V.

Input/output buffer 110 includes output driver 114 and input buffer 118. Driver 114 receives signals on enable terminal EN and data input terminal A. When enable terminal EN is at the high internal voltage VDDI, driver 114 drives input/output terminal YIO connected to the bus with a signal logically equivalent to the signal on data input terminal A. In particular, when terminal A is at VDDI, driver 114 drives terminal YIO with voltage EXTVDD. When terminal A is at ground, driver 114 drives terminal YIO with the ground voltage.

When enable terminal EN is low, that is, 0 V, driver 114 tri-states input/output terminal YIO. Input buffer 118 translates the zero-or-EXTVDD level input signals on terminal YIO into zero-or-VDDI level signals on terminal Y.

Driver 114 includes NAND gate 126 which has one input connected to enable terminal EN and the other input connected to data input terminal A. In some embodiments, all the logic gates including gate 126 and all the inverters are implemented in CMOS technology. The transistor sizes of the logic gates and inverters in some embodiments are shown next to the gate or inverter symbols in the drawings. Thus, in some embodiments each PMOS transistor of gate 126 has the channel width of 20 μm ("wp=20"). Each NMOS transistor of gate 126 has the channel width of 30 μm ("wn=30"). The channel lengths are 1 μm unless specifically noted otherwise.

NAND gate 126 is powered by internal voltage VDDI.

The output of gate 126 is connected to source/drain terminal 130.1 of NMOS transistor 130. The transistor sizes in some embodiments are shown next to the transistor symbols. Thus, in some embodiments transistor 130 has the channel width/length dimension of 30 μm/1 μm.

The other source/drain terminal 130.2 of transistor 130 is connected to the gate of PMOS pull-up transistor 134. The gate of transistor 130 is connected to internal supply voltage VDDI.

The source and the backgate of transistor 134 are connected to external supply voltage EXTVDD. The drain is connected to input/output terminal YIO.

Bootstrap circuit 138 pulls the gate of transistor 134 to EXTVDD when the output of NAND gate 126 is at the high internal voltage level VDDI. More particularly, the gate of transistor 134 is connected to the gates of PMOS transistor 142 and NMOS transistor 146. The source and the backgate of transistor 142 are connected to external supply voltage EXTVDD. The source of transistor 146 is connected to ground. The drains of transistors 142, 146 are connected to the gate of PMOS transistor 150. The source and the backgate of transistor 150 are connected to external supply voltage EXTVDD. The drain is connected to the gate of transistor 134.

When NAND gate 126 drives on its output the voltage VDDI to turn off transistor 134, transistor 130 charges the gate of transistor 134 to the voltage VDDI–VTN where VTN is the threshold voltage of transistor 130. In some embodiments, the NMOS transistor threshold voltages VTN are 0.7V and the PMOS transistor threshold voltages VTP are −0.9 V. Thus, in some embodiments is VDDI=3.3 V, transistor 130 charges the gate of transistor 134 to 3.3−0.7= 2.6 V. This voltage is above the threshold voltage of the inverter formed by transistors 142, 146 —the inverter threshold voltage is about 2.15 V. Consequently, the inverter drives the gate of transistor 150 to 0 V. Transistor 150 turns on and pulls the gate of transistor 134 up to EXTVDD. Transistor 134 completely turns off thus reducing power consumption. The gate of transistor 142 is also at EXTVDD turning the transistor completely off and thus further reducing power consumption.

As soon as the gate of transistor 134 is pulled above VDDI–VTN, transistor 130 turns off isolating the gate of transistor 134 from NAND gate 126. Thus transistor 130 protects NAND gate 126 from the high voltage on the gate of transistor 134 and prevents the charge leakage from the gate of transistor 134 to the internal power supply VDDI through NAND gate 126.

When NAND gate 126 drives its output with a ground voltage, transistor 130 is on providing the ground voltage on the gate of transistor 134. The inverter formed by transistors 142, 146 drives the gate of transistor 150 to EXTVDD turning the transistor off.

Data input terminal A is connected to one input of NOR gate 156. Enable terminal EN is connected through inverter 160 to the other input of NOR gate 156. NOR gate 156 and inverter 160 are powered by internal voltage VDDI. The output of NOR gate 156 is connected to the gate of NMOS pull-down transistor 164. The source of transistor 164 is connected to ground and the drain is connected to input/output terminal YIO.

The backgates of all the NMOS transistors of buffer 110 are connected to ground. The backgates of all the PMOS transistors except transistors 142, 150 and 134 are connected to VDDI.

When enable terminal EN is high, logic gates 126, 156 each invert the signal on data input terminal A. If terminal A is high, transistor 134 is on and transistor 164 is off. Transistor 134 drives the voltage EXTVDD on terminal YIO.

If terminal A is low, transistor 164 is on and transistor 134 is off. Transistor 164 pulls the terminal YIO to ground.

When enable terminal EN is low, transistors 134, 164 are off. Output driver 114 is thus disabled. Input buffer 118 translates a zero-or-EXTVDD voltage on terminal YIO to a zero-or-VDDI voltage on terminal Y.

More particularly, input buffer 118 includes inverters 170 and 174 powered by voltage VDDI. Inverter 170 translates a zero-or-EXTVDD voltage on terminal YIO to a zero-or-VDDI voltage on the input of inverter 174. Inverter 174 inverts the signal on its input and provides a zero-or-VDDI voltage on terminal Y.

Figure 2:
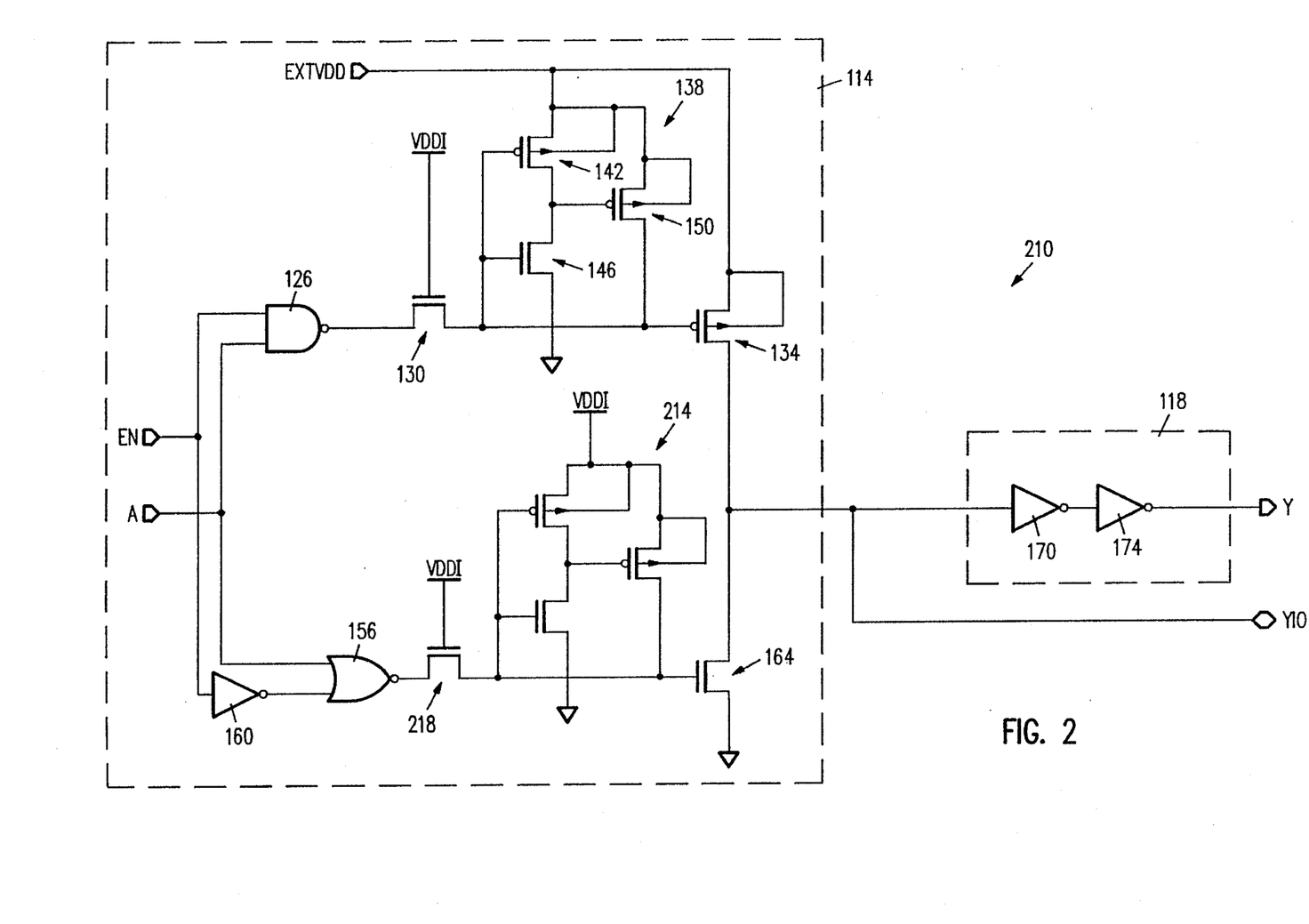

Input/output buffer 210 of FIG. 2 is similar to buffer 110. Buffer 210 includes in addition bootstrap circuit 214 to pull up the voltage on the gate of transistor 164 to the external supply voltage EXTVDD when NOR gate 156 provides the internal high level VDDI. Pulling up the gate of transistor 164 to the high voltage EXTVDD allows increasing the pull-down current and the power of driver 114. When the gate of transistor 164 is pulled up, NMOS transistor 218 isolates the gate of transistor 164 from NOR gate 156 similarly to transistor 130.

Figure 3:
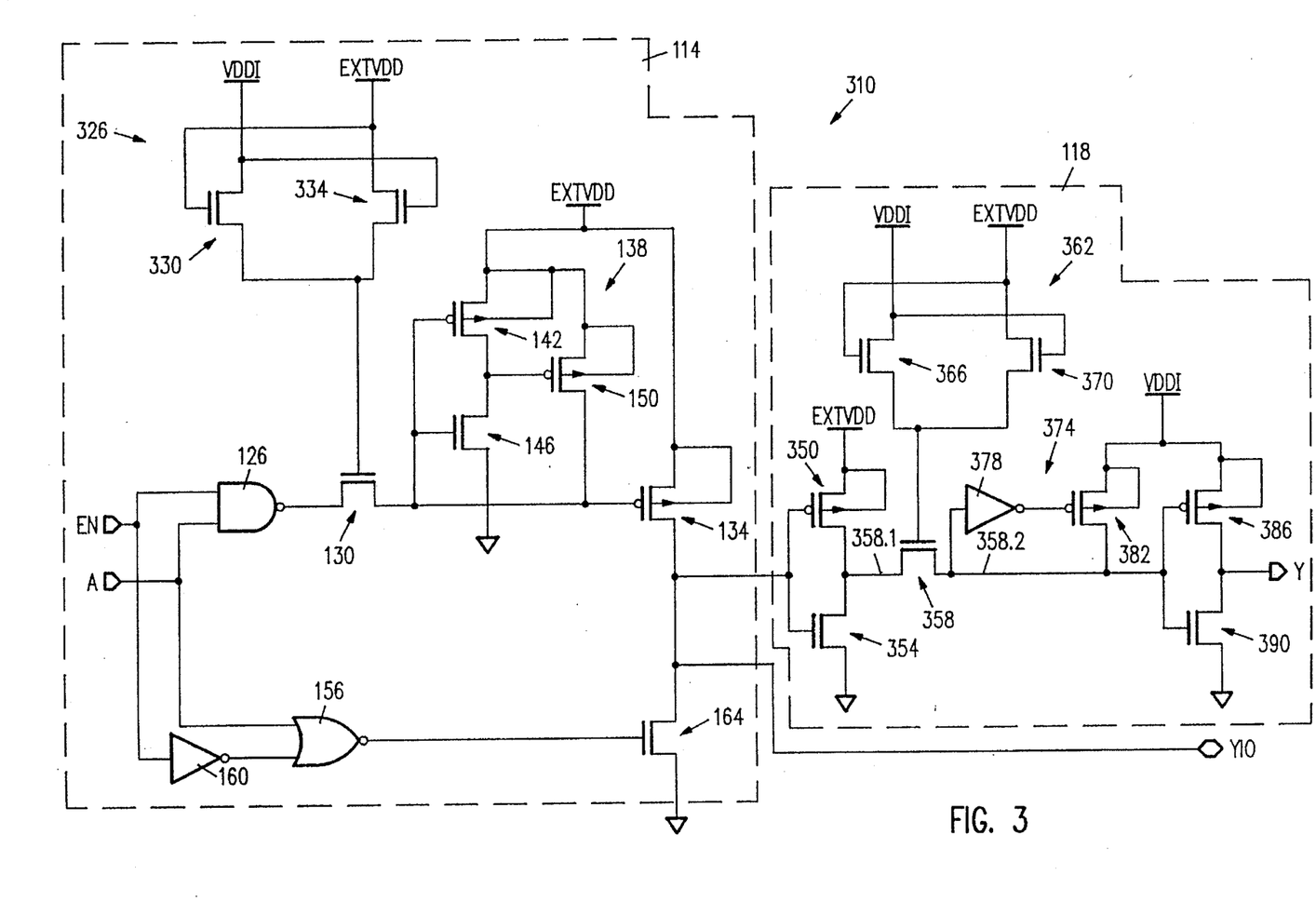

Input/output buffer 310 of FIG. 3 is suitable for systems in which the internal supply voltage VDDI may be higher than the external supply voltage EXTVDD. More generally, for buffer 310 the internal supply voltage VDDI may be higher than, lower than, or equal to the external supply voltage EXTVDD.

In some embodiments, the module (not shown) containing buffer 310 is formed in an integrated circuit having two power pins. One power pin receives voltage VDDI, and the other power pin receives voltage EXTVDD. In some embodiments, such a module can operate at VDDI=3.3 V and EXTVDD=5.0 V, at VDDI=5.0 V and EXTVDD=3.3 V, at VDDI=EXTVDD=3.3 V, and at VDDI=EXTVDD=5.0 V.

NAND gate 126, NOR gate 156, inverter 160, pull-up transistor 134 and pull-down transistor 164 are connected similarly to buffer 110. Bootstrap circuit 138 and transistor 130 are also similar to those of buffer 110. The gate of transistor 130 is driven by circuit 326 providing a voltage VG substantially equal to the smallest of VDDI, EXTVDD. Circuit 326 includes NMOS transistors 330, 334 whose sources are connected to the gate of transistor 130. The gate of transistor 330 and the drain of transistor 334 are connected to voltage EXTVDD. The drain of transistor 330 and the gate of transistor 334 are connected to voltage VDDI. If VDDI=3.3 V and EXTVDD=5.0 V, transistor 330 charges the gate of transistor 130 to VG=3.3 V. If VDDI=5.0 V and EXTVDD=3.3 V, transistor 334 charges the gate of transistor 130 to the same voltage VG=3.3 V. If VDDI=EXTVDD, transistors 330, 334 charge the gate of transistor 130 to VG=VDDI−VTN.

When NAND gate 126 drives its output with the internal high level voltage VDDI, transistor 130 charges the gate of pull-up transistor 134 to the voltage VG−VTN. This voltage is above the threshold voltage of the inverter formed by transistors 142, 146. Hence, transistor 150 turns on and charges the gates of transistors 134, 142 to EXTVDD. EXTVDD is greater than or equal to VG, and hence transistor 130 turns off.

When enable terminal EN is low, transistors 134 and 164 are off. Driver circuit 114 tri-states input/output terminal YIO. Input buffer 118 translates the zero-or-EXTVDD signal on terminal YIO to a zero-or-VDDI signal on terminal Y.

More particularly, the inverter formed by transistors 350, 354 amplifies the signal on terminal YIO and provides a zero-or-EXTVDD voltage on source/drain terminal 358.1 of NMOS transistor 358. The source and the backgate of transistor 350 are connected to external supply voltage EXTVDD. The gate is connected to the gate of NMOS transistor 354 and to terminal YIO. The source of transistor 354 is connected to ground. The drains of transistor 350, 354 are connected to source/drain terminal 358.1 of transistor 358.

The gate of transistor 358 is connected to the output of circuit 362 similar to circuit 326. Circuit 362 is formed by NMOS transistors 366, 370. Circuit 362 drives the gate of transistor 358 with voltage VG. Thus, as the voltage on source/drain terminal 358.1 varies between 0 V and EXTVDD, the voltage on the other source/drain terminal 358.2 of transistor 358 varies between 0 V to VG−VTN.

Bootstrap circuit 374 pulls the voltage on terminal 358.2 to VDDI. Circuit 374 includes inverter 378 powered by internal voltage VDDI. The input of inverter 378 is connected to terminal 358.2, and the output is connected to the gate of PMOS transistor 382. The source and the backgate of transistor 382 are connected to voltage VDDI. The drain is connected to terminal 358.2. When the voltage on terminal 358.2 is VG−VTN, the output of inverter 378 is 0 V because VG−VTN is above the inverter threshold voltage. Transistor 382 pulls terminal 358.2 up to voltage VDDI. Transistor 358 turns off isolating terminal 358.2 from terminal 358.1. The power consumption in CMOS inverter 378 goes down to zero.

Terminal 358.2 is connected to the gates of PMOS transistor 386 and NMOS transistor 390. The source and the backgate of transistor 386 are connected to voltage VDDI. The source of transistor 390 is connected to ground. The drains of transistors 386, 390 are connected to terminal Y. The inverter formed by transistors 386, 390 inverts the signal on terminal 358.2. When terminal 358.2 is at VDDI, the inverter provides a 0 V signal on terminal Y.

When the voltage on terminal YIO is EXTVDD, the voltage on terminal 358.1 is 0 V. Transistor 358 is on pulling terminal 358.2 down to 0 V. Inverter 378 supplies the voltage VDDI to the gate of transistor 382 turning the transistor off. The inverter formed by transistors 386, 390 drives the terminal Y with the voltage VDDI.

Figure 4:
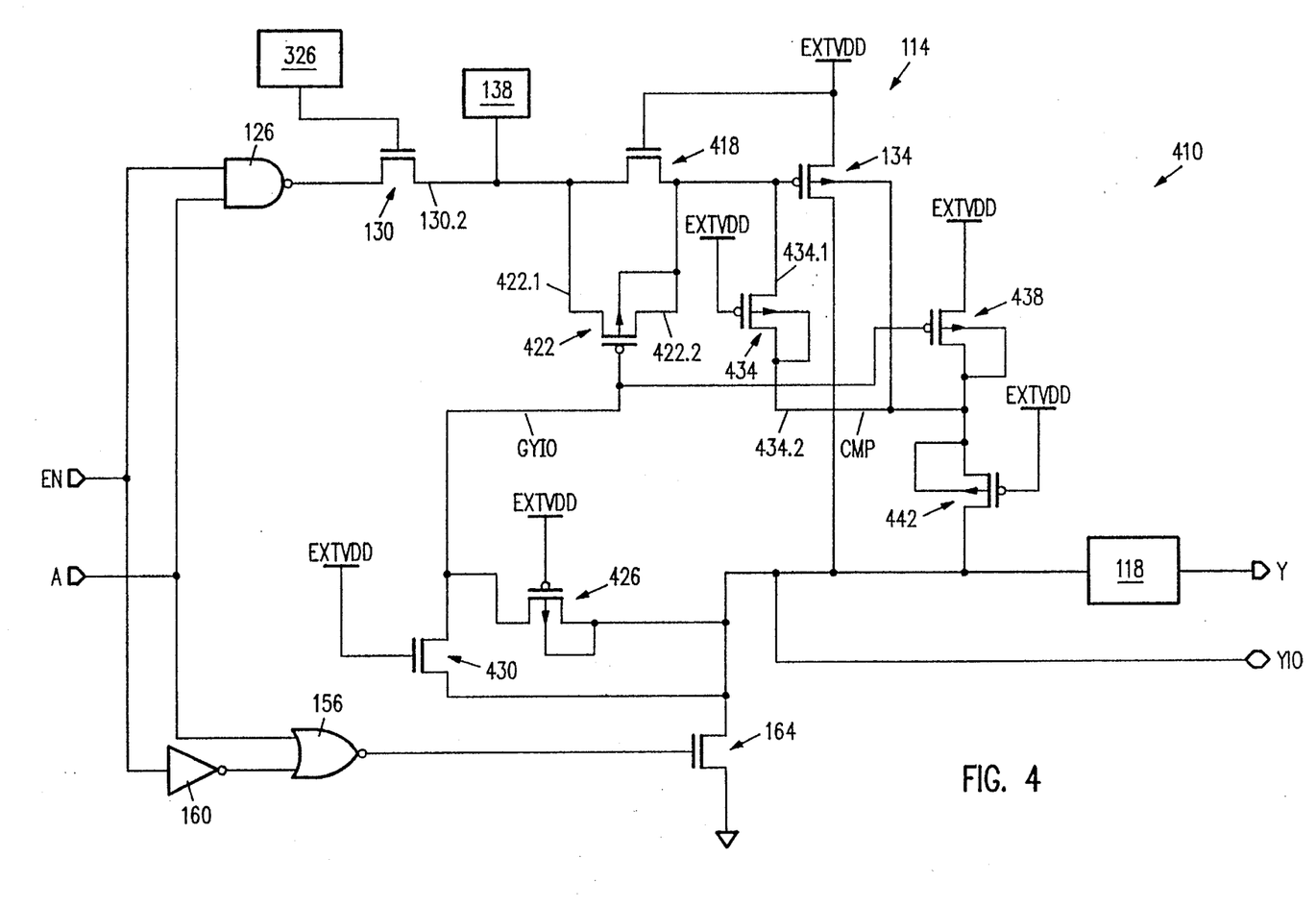

Input/output buffer 410 of FIG. 4 includes the circuitry of buffer 310 plus an overvoltage protection circuitry which prevents charge leakage from terminal YIO to external voltage supply EXTVDD when the voltage on terminal YIO exceeds EXTVDD. The voltage on terminal YIO may exceed EXTVDD when, for example, driver 114 is disabled and another module (not shown) drives the bus with a voltage exceeding EXTVDD. The voltage on terminal YIO may also exceed EXTVDD if the module containing buffer 410 is powered down to save power or to replace the module while other modules in the system remain in operation. When the module is powered down, EXTVDD is set at 0 V in some embodiments.

In buffer 410, NAND gate 126, NOR gate 156, inverter 160, circuits 326 and 138, pull-down transistor 164 and input buffer 118 are similar to those of buffer 310. As in buffer 310, circuit 138 of buffer 410 is connected to source/drain terminal 130.2 of transistor 130. Terminal 130.2 is connected to the gate of pull-up transistor 134 through NMOS transistor 418 and, in parallel, though PMOS transistor 422. The gate of transistor 418 is connected to external supply voltage EXTVDD. Source/drain terminal 422.1 of transistor 422 is connected to terminal 130.2. Source/drain terminal 422.2 of transistor 422 is connected to the backgate of the transistor and to the gate of transistor 134. The gate of transistor 422 is connected to node GYIO. Node GYIO is connected to terminal YIO through PMOS transistor 426 and, in parallel, through NMOS transistor 430. The gates of transistors 426, 430 are connected to EXTVDD. The backgate of transistor 426 is connected to terminal YIO.

The gate of transistor 134 is connected to source/drain terminal 434.1 of PMOS transistor 434. The gate of transistor 434 is connected to EXTVDD. The backgate is connected to the transistor source/drain terminal 434.2 which is connected to node CMP at the output of the comparator formed by PMOS transistors 438 and 442. The source of transistor 438 is connected to EXTVDD. The gate is connected to node GYIO. The backgate and the drain are connected to node CMP. The source of transistor 442 is connected to terminal YIO. The gate is connected to EXTVDD. The backgate and the drain are connected to node CMP.

Figure 5:
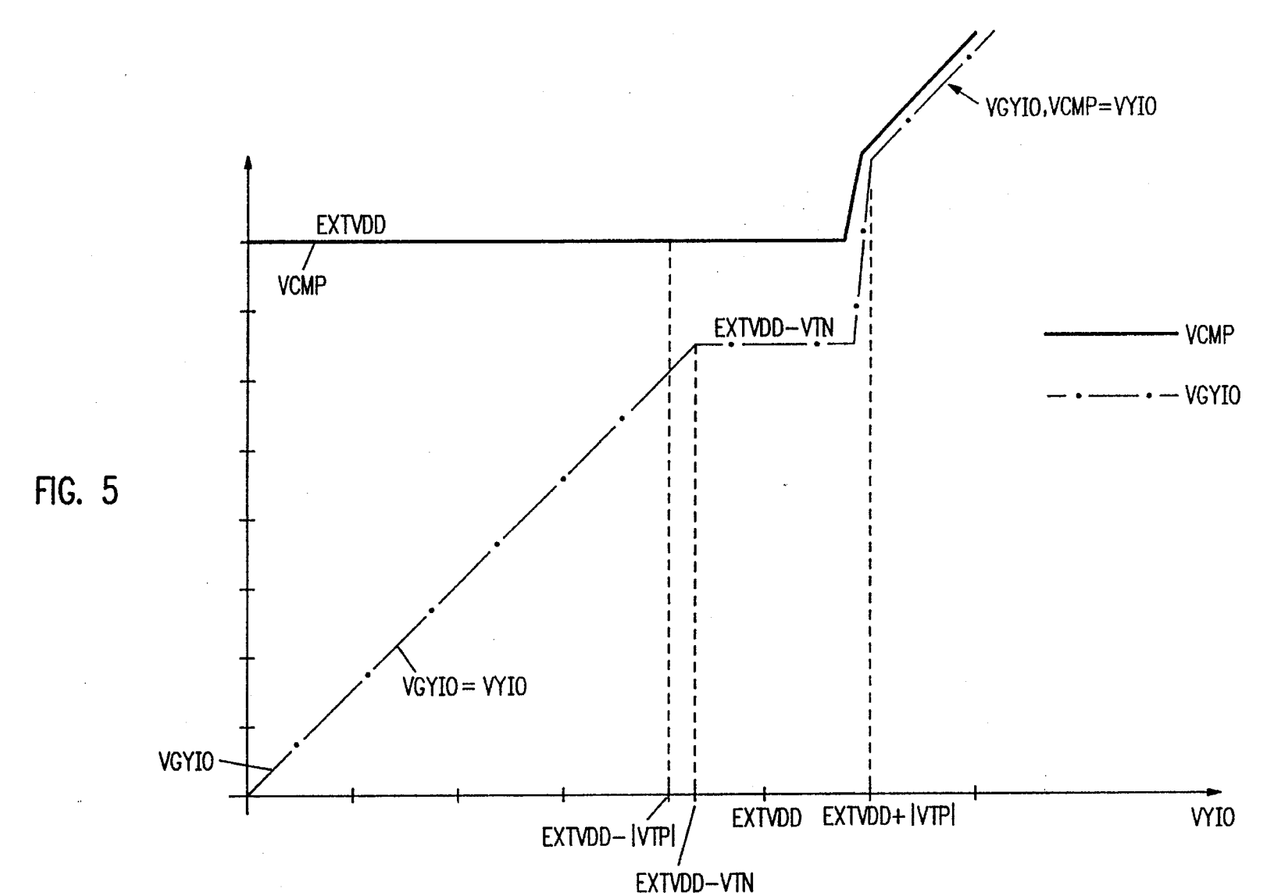
FIG. 5 is a graph of certain voltages in the buffer of FIG. 4.

When driver 114 is disabled and the voltage VYIO on terminal YIO exceeds EXTVDD+|VTP|, transistors 442, 434 keep the voltage on the gate and the backgate of transistor 134 at VYIO thus preventing charge leakage through transistor 134 to external voltage supply EXTVDD. The operation of transistors 438, 442, 434 is explained below with reference to FIG. 5. FIG. 5 illustrates voltages VGYIO, VCMP on respective nodes GYIO, CMP versus the voltage VYIO. The voltage VGYIO is shown by a broken line. When VYIO is below EXTVDD−VTN, transistor 430 charges node GYIO to the voltage VYIO. When VYIO exceeds EXTVDD−VTN, transistor 430 charges node GYIO to EXTVDD−VTN. When VYIO reaches or exceeds EXTVDD+|VTP|, transistor 426 turns on charging node GYIO to VYIO.

When the voltage VYIO is below EXTVDD−|VTP|, the voltage VGYIO is also below EXTVDD−|VTP|. Transistor 438 is therefore on charging node CMP to EXTVDD. When the voltage VYIO is between EXTVDD−|VTP| and EXTVDD+|VTP|, the gate-to-source voltage of transistor 438 is −VTN which is above the threshold voltage VTP.

However, −VTN is so close to VTP that the subthreshold current through transistor 438 is sufficient to charge the low capacitance node CMP to EXTVDD.

The source/backgate diodes of transistors 438, 134 help charge node CMP to the voltage EXTVDD−VD where VD is the forward diode drop voltage (0.65 V in some embodiments). The source/backgate diode of transistor 442 helps charge node CMP to the voltage VYIO−VD.

As voltage VYIO approaches EXTVDD+|VTP|, the subthreshold current through transistor 426 pulls node GYIO up decreasing the current through transistor 438. However, at the same time, the subthreshold current through transistor 442 is increased. When voltage VYIO reaches or exceeds EXTVDD+|VTP|, transistor 442 turns on charging node CMP to the voltage VYIO.

When enable terminal EN is driven low to disable driver 114, circuit 138 charges node 130.2 to EXTVDD. Transistor 418 charges the gate of transistor 134 to EXTVDD−VTN. If the voltage VYIO is below EXTVDD−|VTP|, the voltage VGYIO is also below EXTVDD−|VTP|, and transistor 422 is on charging the gate of transistor 134 to EXTVDD. If the voltage VYIO is between EXTVDD−|VTP| and EXTVDD+|VTP|, transistor 422 is in the subthreshold region because VGYIO=EXTVDD−VTN and because VTN is smaller than |VTP|. The voltage drop VTN between terminal 422.1 and the gate of transistor 422 is so close to |VTP| that the subthreshold current through transistor 422 charges the low capacitance gate of transistor 134 to EXTVDD.

Transistor 418 helps charge the gate of transistor 134 to the voltage EXTVDD−VTN. The diode formed by terminal 422.1 and the backgate of transistor 422 helps charge the gate of transistor 134 to EXTVDD−VD.

When the voltage VYIO reaches or exceeds EXTVDD+|VTP|, the conduction through pull-up transistor 134 is suppressed as follows. The voltage on node CMP becomes equal to VYIO. Consequently, transistor 434 turns on charging the gate of transistor 134 to the voltage VYIO. Thus the field effect conduction through transistor 134 is suppressed. The backgate of transistor 134 is also at voltage VYIO. Hence the drain/backgate diode conduction is also suppressed.

Since the gate voltage of transistor 134 is greater than EXTVDD, transistor 418 is off. The gate voltage VGYIO of transistor 422 is equal to the voltage VYIO on terminal 422.2, and hence transistor 422 is also off. Transistors 418 and 422 thus isolate the gate of transistor 134 from terminal 130.2.

When the module containing the buffer 410 is powered down so that EXTVDD is 0 V, the circuit operation is similar to prevent the leakage from terminal YIO to EXTVDD.

When enable terminal EN is high, the buffer operates as follows. When data input terminal A is high, terminal 130.2 is at 0 V. Transistor 418 is on, pulling the gate of transistor 134 down to 0 V. Transistor 134 is on charging terminal YIO to EXTVDD.

When data input terminal A becomes low, terminal 130.2 is charged to EXTVDD. Transistor 418 charges the gate of transistor 134 to EXTVDD−VTN. Before terminal YIO is pulled down by transistor 164, transistor 430 holds node GYIO at the voltage EXTVDD−VTN. The charge leakage through transistor 422 due to the fact that the transistor gate-to-source voltage is close to VTP and also due to the diode formed by terminal 422.1 and the backgate of transistor 422 help pull up the voltage on the gate of transistor 134 to EXTVDD. Moreover, as transistor 164 pulls down the voltage on terminal YIO, the voltage on terminal GYIO decreases to fully turn on transistor 422. The gate of transistor 134 charges to EXTVDD turning off transistor 134.

In some embodiments, the channel width/length dimension of each NMOS transistor of circuit 326 is 10 μm/1 μm. In buffer 118 of FIG. 4, the channel width/length dimension of each NMOS transistor of circuit 362 (not shown in FIG. 4 but shown in FIG. 3) is also 10 μm/1 μm. The channel width/length dimension of transistor 358 (shown in FIG. 3) is 40 μm/1 μm.

In some embodiments, buffer 410 also includes bootstrap circuit 214 and transistor 218 as in FIG. 2. Circuit 214 is powered by a voltage equal to the maximum of voltages VDDI, EXTVDD to increase the pull-down current and power in buffer 410.

The overvoltage protection circuitry including transistors 438, 442, 434, 418, 422, 426 and 430 is suitable for drivers which are designed to operate at VDDI=EXTVDD and which, therefore, do not include the voltage translation circuitry. In particular, in some embodiments, transistor 130, circuit 326 and bootstrap circuit 138 are omitted. The output of NAND gate 126 is connected directly to one source/drain terminal of each of transistors 418, 422. When driver 114 is disabled and another module (not shown) drives the bus with a voltage exceeding EXTVDD, the overvoltage protection circuitry prevents charged leakage from terminal YIO to voltage supply EXTVDD as discussed above.

While the invention has been illustrated with respect to the embodiments described above, other embodiments and variations are within the scope of the invention. In particular, the invention is not limited by the transistor sizes or threshold voltages. The invention is suitable for output buffers, that is, in some embodiments input buffer 118 is omitted. The invention is also suitable for buffers in which output driver 114 omitted. The invention is not limited by particular voltage values. In some embodiments, VDDI is negative. A non-ground reference voltage is used in some embodiments. The invention is not limited by particular fabrication technology. Thus, in some embodiments, the invention is implemented using NWELL CMOS technology in which circuits are formed on a P-doped substrate and the PMOS transistors are formed in one or more NWELLs. In other embodiments, PWELL technology or twin tub technology is used. In some embodiments, the entire input/output buffer is integrated, while in other embodiments discrete components are used. In some embodiments, the bus is integrated with one or more modules, while in other embodiments the bus is not integrated. Other embodiments and variations are within the scope of the invention is defined by the following claims.

What is claimed is:

1. An output driver comprising:

a power terminal for receiving a voltage V2;

an output terminal T1;

a transistor TR3 connecting said power terminal to said output terminal;

a circuit C1 for driving a gate of said transistor TR3 with a signal depending on an input signal of said output driver;

a comparator circuit comprising an output terminal T2 and further comprising:
   a transistor CMPTR1 for connecting said output terminal T2 to said voltage V2;
   a transistor CMPTR2 connecting said output terminal T2 to said output terminal T1;
   a transistor CMPTR3 connecting said output terminal T1 to a gate of said transistor CMPTR1; and a transistor CMPTR4 having a transistor type that is complementary to a transistor type of said transistor CMPTR3 connecting said output terminal T1 to the gate of said transistor CMPTR1; and means for connecting said terminal T2 to the gate and the backgate of said transistor TR3.

2. An output driver comprising:

a power terminal;

an output terminal;

a first transistor having a source/drain path coupling the power terminal to the output terminal and having a gate and a backgate;

a drive circuit having an input terminal coupled to an input signal node and having an output terminal coupled to the gate of the first transistor;

a comparator circuit including:
 a comparator output terminal coupled to the backgate of the first transistor;
 a first comparator transistor having a source/drain path coupling the comparator output terminal to the power terminal and having a gate;
 a second comparator transistor having a source/drain path coupling the comparator output terminal to the output terminal and having a gate coupled to the power terminal;
 a third comparator transistor having a source/drain path coupling the output terminal to the gate of the first comparator transistor; and
 a fourth comparator transistor of a transistor type that is complementary to a transistor type of the third comparator transistor, the fourth comparator having a source/drain path coupling the output terminal to the gate of the first comparator transistor and having a gate coupled to the power terminal.

3. An output driver as in claim 2 wherein the drive circuit further comprises:

a first drive circuit transistor having a source/drain path coupling the input signal node to the gate of the first transistor and having a gate coupled to the power terminal; and a second drive circuit transistor having a source/drain path coupling the comparator output terminal to the gate of the first transistor and having a gate coupled to the power terminal.

4. An output driver as in claim 3 wherein the drive circuit further comprises:

a third drive circuit transistor having a source/drain path coupling the input signal node to the gate of the first transistor and having a gate coupled to the gate of the first comparator transistor.

5. An output driver as in claim 4 wherein:

the second drive circuit transistor has a backgate coupled to the comparator output terminal; and the third drive circuit transistor has a backgate coupled to the gate of the first transistor.

6. An output driver as in claim 2 wherein:

the first comparator circuit transistor has a backgate coupled to the comparator output terminal;

the second comparator circuit transistor has a backgate coupled to the comparator output terminal; and the third comparator circuit transistor has a gate coupled to the power terminal and a backgate coupled to the output terminal.

7. An overvoltage protection circuit in an output driver driving a bus and powered by a power source comprising:

a pullup transistor having a source/drain path coupled between the power source and the bus and having a gate and a backgate;

a drive circuit having an input terminal coupled to the bus and an output terminal coupled to the gate of the pullup transistor; and a comparator having a power terminal coupled to the power source, a bus terminal coupled to the bus and a control terminal coupled to the input terminal of the drive circuit and to the backgate of the pullup transistor, the comparator comparing a power supply voltage to a bus voltage and generating the bus voltage on the control terminal so that the bus voltage is applied to the gate and the backgate of the pullup transistor when the voltage on the bus exceeds in magnitude the power supply voltage by a pullup transistor threshold voltage in operating conditions when the power source is active and when the power source is inactive;

wherein the comparator further comprises:
 a first comparator transistor having a source/drain path coupling the control terminal to the power terminal and having a gate;
 a second comparator transistor having a source/drain path coupling the control terminal to the bus terminal and having a gate coupled to the power terminal;
 a third comparator transistor having a source/drain path coupling the bus terminal to the gate of the first comparator transistor; and
 a fourth comparator transistor of a transistor type that is complementary to a transistor type of the third comparator transistor, the fourth comparator having a source/drain path coupling the bus terminal to the gate of the first comparator transistor and having a gate coupled to the power terminal.

8. A circuit as in claim 7 wherein the drive circuit further comprises:

a first drive circuit transistor having a source/drain path coupling the input terminal to the gate of the pullup transistor and having a gate coupled to the power terminal; and a second drive circuit transistor having a source/drain path coupling the control terminal to the gate of the pullup transistor and having a gate coupled to the power terminal.

9. An output driver as in claim 8 wherein the drive circuit further comprises:

a third drive circuit transistor having a source/drain path coupling the input terminal to the gate of the pullup transistor and having a gate coupled to the gate of the first comparator transistor.

10. An output driver as in claim 9 wherein:

the second drive circuit transistor has a backgate coupled to the control terminal; and the third drive circuit transistor has a backgate coupled to the gate of the pullup transistor.

11. An output driver as in claim 7 wherein:

the first comparator circuit transistor has a backgate coupled to the control terminal;

the second comparator circuit transistor has a backgate coupled to the control terminal; and the third comparator circuit transistor has a gate coupled to the power terminal and a backgate coupled to the bus terminal.

12. A circuit as in claim 7 wherein the drive circuit further comprises:

a first drive circuit transistor having a source/drain path coupling the input terminal to the gate of the pullup transistor and having a gate coupled to the power terminal; and a second drive circuit transistor having a source/drain path coupling the control terminal to the gate of the pullup transistor and having a gate coupled to the power terminal.

\* \* \* \* \*

UNITED STATES PATENT AND TRADEMARK OFFICE
CERTIFICATE OF CORRECTION

PATENT NO. : 5,534,795
DATED : July 9, 1996
INVENTOR(S) : Joseph D. Wert and Richard L. Duncan It is certified that error appears in the above-indentified patent and that said Letters Patent is hereby corrected as shown below:

Column 7, Line 43 after "EXTVDD" insert --+|VTP|or higher--

Signed and Sealed this

Fourth Day of March, 1997

Attest:

BRUCE LEHMAN

Attesting Officer     Commissioner of Patents and Trademarks